(12) United States Patent
Gander

(10) Patent No.: US 6,552,441 B1
(45) Date of Patent: Apr. 22, 2003

(54) ELECTRONIC CONTROL UNIT FOR A MOTOR VEHICLE

(75) Inventor: Helmut Gander, Regensburg (DE)

(73) Assignee: Siemens Aktiengesellschaft, Munich (DE)

(*) Notice: Subject to any disclaimer, the term of this patent is extended or adjusted under 35 U.S.C. 154(b) by 0 days.

(21) Appl. No.: 09/321,173

(22) Filed: May 27, 1999

(30) Foreign Application Priority Data

May 27, 1998 (DE) .......................................... 198 23 685

(51) Int. Cl.⁷ .............................................. B60R 16/00
(52) U.S. Cl. ........................ 307/9.1; 307/117; 307/10.1
(58) Field of Search ................ 307/10.1, 117, 307/9.1; 338/25

(56) References Cited

U.S. PATENT DOCUMENTS

| | | | |
|---|---|---|---|
| 5,406,246 A | * 4/1995 | Friese et al. | 338/25 |
| 5,522,663 A | * 6/1996 | Fichter et al. | 374/183 |
| 5,749,060 A | 5/1998 | Graf et al. | |
| 5,781,098 A | * 7/1998 | Shibata | 338/28 |
| 5,823,680 A | * 10/1998 | Kato et al. | 338/28 |

FOREIGN PATENT DOCUMENTS

| | | |
|---|---|---|
| DE | 93 07 228.7 | 8/1993 |
| DE | 295 13 950 U1 | 2/1997 |
| DE | 196 11 024 C1 | 5/1997 |
| EP | 0 309 986 A1 | 4/1989 |
| EP | 0 758 726 A2 | 2/1997 |

OTHER PUBLICATIONS

International Patent Application WO 91/12428 (Deutsch), dated Aug. 22, 1991.
International Patent Application WO 93/21436 (Laufer et al.), dated Oct. 28, 1993.

* cited by examiner

Primary Examiner—Fritz Fleming
(74) Attorney, Agent, or Firm—Laurence A. Greenberg; Werner H. Stemer; Ralph E. Locher

(57) ABSTRACT

A control unit has a circuit support, on which electrical and/or electronic components of an electronic circuit of the control unit are disposed. The circuit support is composed of a temperature-resistant ceramic material, and on it there is applied at least one resistive track made of a material whose electrical resistance is temperature-dependent. The resistive track is connected to an evaluation circuit that determines the temperature using resistance values measured on the resistive track. The circuit support is in thermally conductive contact with the environment that is to be taken into consideration.

5 Claims, 2 Drawing Sheets

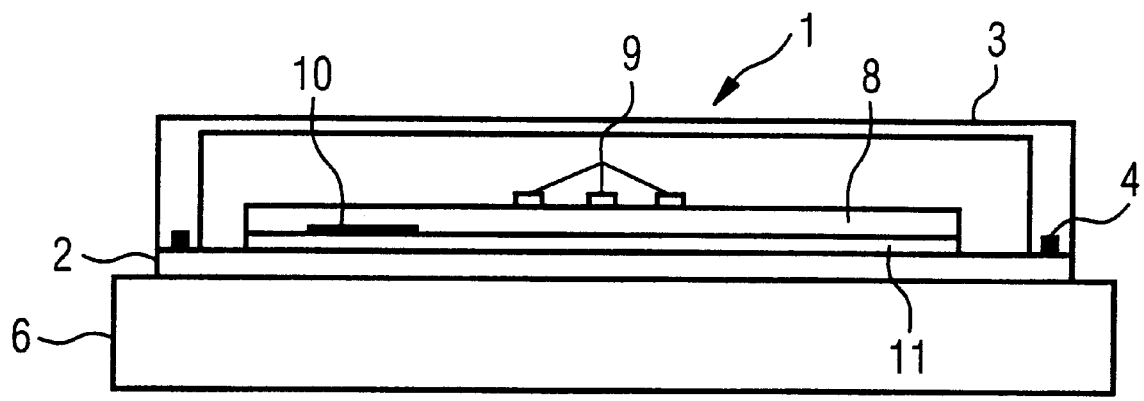
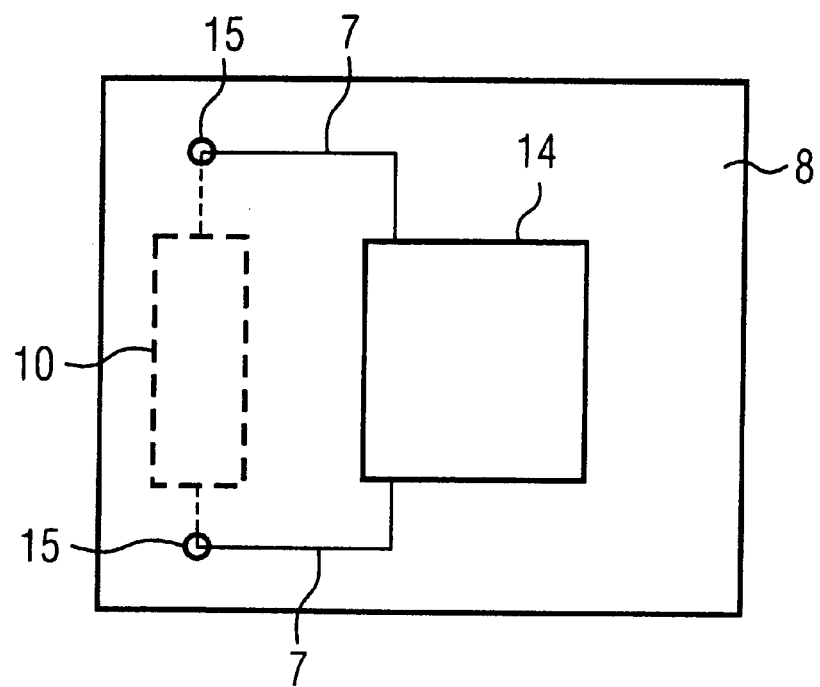

ELECTRONIC CONTROL UNIT FOR A MOTOR VEHICLE

BACKGROUND OF THE INVENTION

FIELD OF THE INVENTION

The invention relates to an electronic control unit for a motor vehicle, in particular for an automatic motor vehicle transmission. The control unit has a circuit support made of a temperature-resistant ceramic material on which electrical or electronic components of the control unit are disposed. In addition, there is a temperature sensor for detecting a temperature of an environment to be taken into consideration and the sensor is connected to an evaluation circuit.

Modern electronic control units in automotive engineering are increasingly constructed directly on or in the apparatus to be controlled. Thus, for example, electronic transmission control units within an automatic transmission are built into the oil sump or injection oil region or are built onto the transmission casing as disclosed in Published European Patent Application EP 0 758 726 A2. Engine control units are built onto the engine or the intake tract, for example. In order to control the apparatuses, it is frequently necessary to detect the apparatus temperature or the temperature of a surrounding medium (for example the transmission oil temperature).

In the case of a known transmission controller built onto the casing of the transmission, a separate temperature sensor is mounted on an electronic assembly. However, the transmission controller is not immersed in the transmission oil, its electronic assembly is only connected by a duct to a region of the transmission that contains transmission oil. Such a controller is disclosed in German Utility Model DE 295 13 950 U1.

An advanced transmission control unit is disposed within the transmission casing as disclosed in German Utility Model DE 93 07 228 U1, the necessity for accurate temperature measurement not being discussed in that case. Another known control unit is disposed on the intake tract of a motor vehicle engine as disclosed in German Patent DE 96 11 024 C1. The heat loss from power components is effectively dissipated by a strong stream of air, but the temperature of the intake air is not measured.

SUMMARY OF THE INVENTION

It is accordingly an object of the invention to provide an electronic control unit for a motor vehicle which overcomes the above-mentioned disadvantages of the prior art devices of this general type.

With the foregoing and other objects in view there is provided, in accordance with the invention, an electronic control unit for a motor vehicle, including:

a circuit support made of a temperature-resistant ceramic material, the circuit support to be thermally conductively connected to a surrounding medium;

electrical/electronic components disposed on the circuit support;

an evaluation circuit; and at least one resistive track made of a material having a temperature-dependent electrical resistance applied onto the circuit support and connected to the evaluation circuit, the evaluation circuit determining a temperature of the surrounding medium using resistance values measured on the at least one resistive track.

The invention is based on the technical problem of providing, with a low outlay, a control unit that enables an accurate temperature measurement and is particularly suitable for being built into a transmission casing or into the intake tract of a motor vehicle engine.

The particular advantages of the invention are that it yields a cost-effective construction technology for the integration of a temperature sensor into an electronic control unit.

Other features which are considered as characteristic for the invention are set forth in the appended claims.

Although the invention is illustrated and described herein as embodied in an electronic control unit for a motor vehicle, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a diagrammatic, lateral sectional view of a control unit according to the invention;

FIG. 3 is a plan view of the control unit with an evaluation circuit according to FIG. 1 or FIG. 2.

DESCRIPTION OF THE PREFERRED EMBODIMENTS

Figure 2:
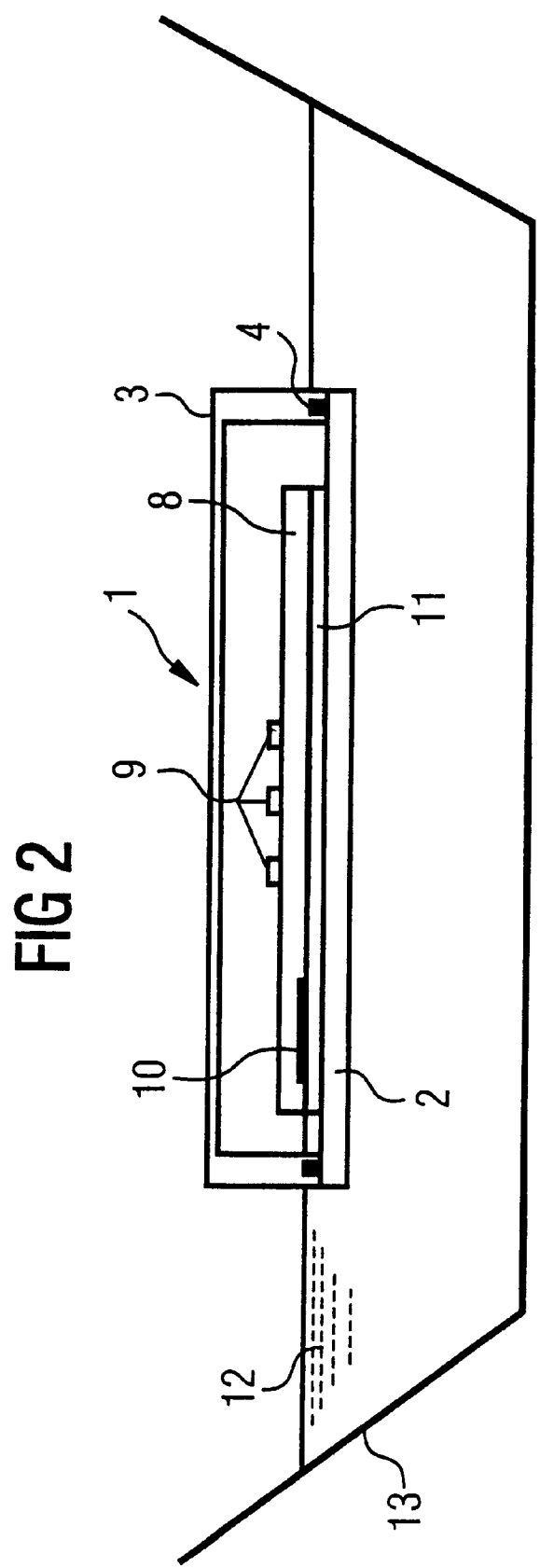
FIG. 2 is a sectional view of a second embodiment of the control unit.

In all the figures of the drawing, sub-features and integral parts that correspond to one another bear the same reference symbol in each case. Referring now to the figures of the drawings in detail and first, particularly, to FIG. 1 thereof, there is shown a control unit 1 having a housing formed of a base plate 2, a cover 3 and a seal 4 which seals the joining area between these two parts. The base plate 2 is thermally conductively connected to an environment 6 that is to be taken into consideration, for example to an apparatus to be controlled. In the exemplary embodiment, the apparatus to be controlled is an automatic transmission 6, which is illustrated only schematically in the drawing and in the casing of which the control unit 1 is accommodated.

If the apparatus to be controlled is a motor vehicle engine, then the base plate 2 is thermally conductively connected to the air flowing through the intake tract of the engine. The intake tract Is generally known per se and is not, therefore, illustrated in detail here.

The actual electronic circuit of the control unit 1 contains a circuit support 8 with electrical and and/or electronic components 9 mounted on its surface, the components 9 being connected to one another by conductor tracks 7 (see FIG. 3). Resistive tracks 10 made of a material having a temperature-dependent electrical resistance are applied on that side of the circuit support 8 which is opposite to the components 9 (the underside of the circuit support 8 in the drawing). Such materials may be e.g. NTC or PTC materials having a positive or negative resistance coefficient, respectively, which is greatly dependent on the temperature. Materials of this type are known; they are composed for example of mixtures of metal oxides and they also exist in the form of pastes. The resistive track 10 can thus be applied in a simple manner in a paste printing process.

The circuit support 8 is fastened on the base plate 2 by a thermally conductive adhesive 11. Since the base plate 2, for its part, is thermally conductively connected to the apparatus 6, i.e. is in thermally conductive contact with the environment which is to be taken into consideration, the resistive track 10 assumes, with only a short delay, the temperature, to be measured, of the apparatus 6 or of another environment to be measured. In the present exemplary embodiment, it is in contact with the transmission 6 or transmission casing 13 (see FIG. 2), in particular with the transmission oil contained therein, or is enclosed by this. If the control unit 1 is configured as an engine control unit, the circuit support 8 is preferably In contact with the intake air, for example by the intake air flowing around the circuit support 8.

Owing to the high temperatures to which the control unit 1 is exposed, the circuit support 8 is produced from a ceramic material. The temperature of the circuit support 8 and thus the temperature, to be measured, of the transmission 6 or of the other environment is determined by measurement of the temperature-dependent resistance of the resistive track 10 in an evaluation circuit 14 (see FIG. 3).

Paste printing is a proven manufacturing process in which a plurality of resistive tracks 10 can also be applied on the circuit support 8 in one process step and a plurality of temperature sensors can thus be produced simultaneously in a simple manner. The evaluation circuit 14 for the resistive tracks 10 serving as temperature sensors is expediently part of the electronic circuit of the control unit 1.

Instead of the temperature of a fixed apparatus 6 such as the transmission controller, the temperature of a liquid or gaseous medium 12 in contact with the base plate 2 can also be measured with the control unit 1 (FIG. 2). In the case of a transmission controller, the surrounding medium is transmission oil contained in the lower region of the transmission casing 13 illustrated diagrammatically. In the case of an engine controller, the surrounding medium is the intake air, by way of example.

One or more of the resistive tracks 10 are applied on the circuit support 8 and connected to the evaluation circuit 14 by in each case two of the conductor tracks 7, which evaluation circuit 14, as mentioned, is expediently part of the electronic circuit of the control unit 1. The conductor tracks 7 partly run on the top surface of the circuit support 8 and they are routed via plated-through holes 15 to the bottom surface of the circuit support 8, the resistive track 10 being applied on the bottom surface.

To summarize, the control unit 1 according to the invention may be described as follows. The control unit 1 has the circuit support 8, on which the electrical and/or electronic components 9 of the electronic circuit of the control unit 1 are disposed. The circuit support 8 is composed of a temperature-resistant ceramic material, and on it there is applied at least one resistive track 10 made of a material whose electrical resistance is temperature-dependent. The resistive track 10 is connected to the evaluation circuit 14 that determines the temperature using resistance values measured on the resistive track 10. The circuit support 8 is in thermally conductive contact with the environment that is to be taken into consideration.

I claim:

1. An electronic control unit for a motor vehicle, comprising:

a circuit support made of a temperature-resistant ceramic material, said circuit support to be thermally conductively connected to a surrounding medium;

electrical/electronic control components including an evaluation circuit, said control components disposed on said circuit support;

at least one resistive track made of a material having a temperature-dependent electrical resistance applied onto said circuit support and connected to said evaluation circuit; and said evaluation circuit determining a temperature of the surrounding medium using resistance values measured on said at least one resistive track and being programmed to provide temperature-related information to said control components dependent upon said resistance values measured on said at least one resistive track.

2. The control unit according to claim 1, wherein said circuit support with said at least one resistive track is to be disposed within a transmission casing and is in contact with transmission oil.

3. The control unit according to claim 1, wherein said at least one resistive track is produced from a material selected from the group consisting of a negative temperature coefficient material and a positive temperature coefficient material and is applied to said circuit support in a paste printing process.

4. The control unit according to claim 1, wherein said circuit support has a first side on which said electrical/electronic components are disposed and a second side opposite said first side on which said at least one resistive track is applied.

5. The control unit according to claim 1, including:

a base plate to be thermally conductively connected to a motor vehicle region whose temperature is to be determined; and a heat-conductive adhesive disposed on said based plate and thermally connecting said circuit support to said base plate.

* * * * *